(12) United States Patent
Jensen et al.

(10) Patent No.: US 9,196,704 B2
(45) Date of Patent: Nov. 24, 2015

(54) SELECTIVE LASER ANNEALING PROCESS FOR BURIED REGIONS IN A MOS DEVICE

(75) Inventors: Jacob Jensen, Beaverton, OR (US); Tahir Ghani, Portland, OR (US); Mark Y. Liu, West Linn, OR (US); Harold Kennel, Portland, OR (US); Robert James, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 13/976,831

(22) PCT Filed: Dec. 19, 2011

(86) PCT No.: PCT/US2011/065926
§ 371 (c)(1),
(2), (4) Date: Jun. 27, 2013

(87) PCT Pub. No.: WO2013/095347
PCT Pub. Date: Jun. 27, 2013

(65) Prior Publication Data
US 2013/0288438 A1    Oct. 31, 2013

(51) Int. Cl.
*H01L 21/768* (2006.01)
*H01L 29/66* (2006.01)
*H01L 21/268* (2006.01)

(52) U.S. Cl.
CPC ........ *H01L 29/66477* (2013.01); *H01L 21/268* (2013.01); *H01L 21/76805* (2013.01); *H01L 29/66628* (2013.01); *H01L 21/76883* (2013.01)

(58) Field of Classification Search
CPC ................... H01L 21/02296; H01L 21/02345; H01L 21/02354; H01L 21/26; H01L 29/40
See application file for complete search history.

(56) References Cited

U.S. PATENT DOCUMENTS

| 6,100,171 | A  | * | 8/2000  | Ishida ........................... 438/535 |
| 6,743,687 | B1 |   | 6/2004  | Yu |
| 2002/0160592 | A1 |   | 10/2002 | Sohn |
| 2007/0034967 | A1 | * | 2/2007  | Nayfeh et al. ................. 257/369 |
| 2008/0220581 | A1 |   | 9/2008  | Allen et al. |
| 2008/0242038 | A1 |   | 10/2008 | Liu et al. |

OTHER PUBLICATIONS

International Search Report and Written Opinion mailed Jul. 30, 2012 for PCT/US2011/065926 filed Dec. 19, 2011, 9 pages.

* cited by examiner

*Primary Examiner* — Cheung Lee
(74) *Attorney, Agent, or Firm* — Blakely, Sokoloff, Taylor & Zafman LLP

(57) ABSTRACT

Laser anneal to melt regions of a microelectronic device buried under overlying materials, such as an interlayer dielectric (ILD). Melting temperature differentiation is employed to selectively melt a buried region. In embodiments a buried region is at least one of a gate electrode and a source/drain region. Laser anneal may be performed after contact formation with contact metal coupling energy into the buried layer for the anneal.

15 Claims, 11 Drawing Sheets

SELECTIVE LASER ANNEALING PROCESS FOR BURIED REGIONS IN A MOS DEVICE

CROSS-REFERENCE TO RELATED APPLICATION

This application is a U.S. National Phase application under 35 U.S.C. §371 of International Application No. PCT/US2011/065926, filed Dec. 19, 2011, entitled SELECTIVE LASER ANNEALING PROCESS FOR BURIED REGIONS IN A MOS DEVICE.

TECHNICAL FIELD

Embodiments of the present invention relate to MOS transistors and more particularly relate to selectively annealing regions after they are buried by subsequently formed layers.

BACKGROUND

While laser "melt" anneal processes for transistors are known, they are not typical in high volume logic device manufacturing. One forecasted application of a pulsed laser anneal process is to melt material and advantageously increase the activation of dopants relative to other forms of anneal where the semiconductor is not melted. Transistor parametrics, such as external resistance ($R_{ext}$), specific contact resistance ($R_c$), etc. may be improved through such melt anneals. However, one challenge is retaining the high activation levels achieved by the melt anneal as the transistor is processed through a remainder of the manufacturing process because post-melt thermal processes tend to deactivate super-activated regions.

Other challenges of laser melt anneal include pattern effects, maintaining gate metal integrity and/or gate oxide integrity during the melt process, and retaining morphology post-melt (particularly where the transistor has a non-planar architecture).

Techniques and the resulting structures that overcome some or all of these challenges is therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1:
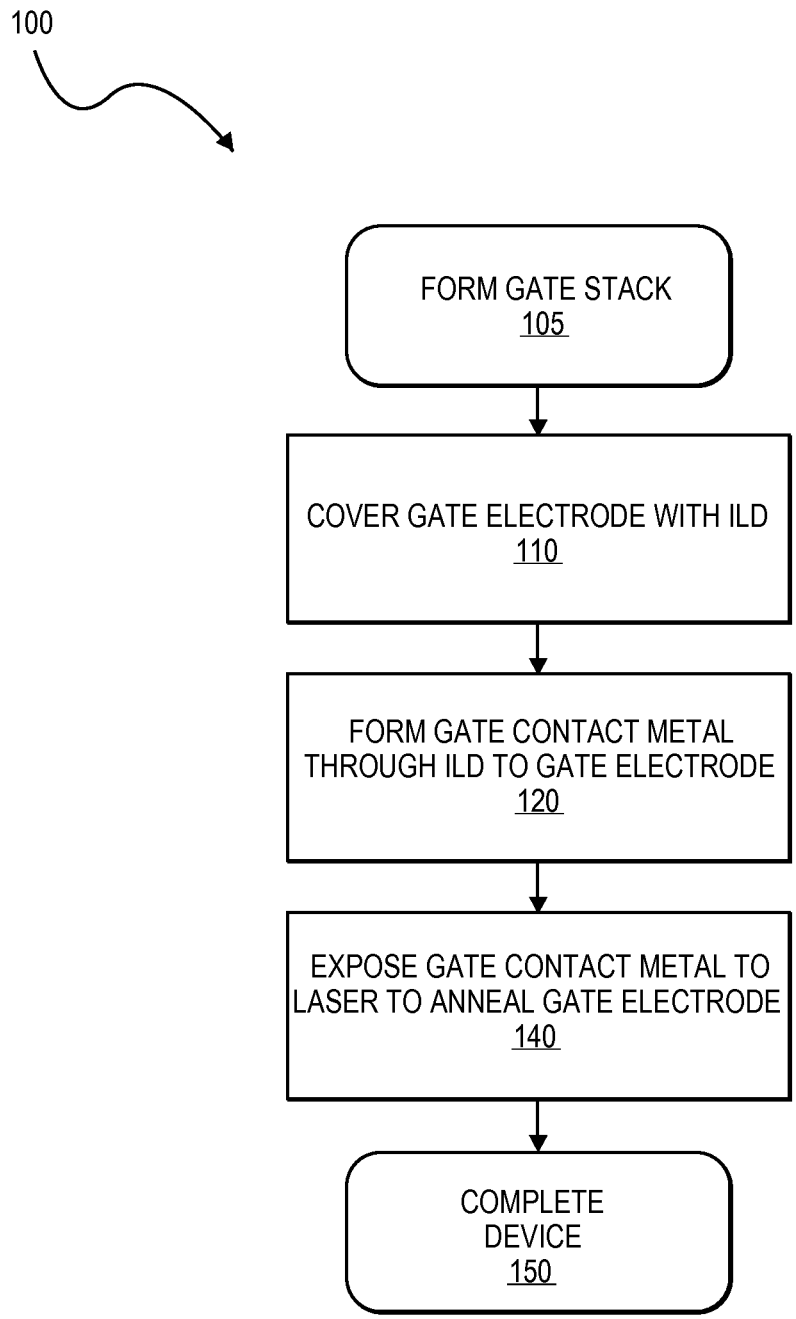
FIG. 1 is a flow diagram illustrating a method including a laser anneal of a buried gate electrode, in accordance with an embodiment.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are microelectronic devices fabricated with techniques includes a laser anneal of regions of the device that are buried under overlying materials, such as an interlayer dielectric (ILD). In embodiments, melting temperature differentiation is employed to selectively melt a buried region. In embodiments, a buried region includes at least a portion of a gate electrode, or at least a portion of a source/drain region. In embodiments, laser anneal is performed after contact formation with contact metal coupling energy into the buried layer for the anneal.

Whereas in conventional laser anneal, a region to be annealed is directly irradiated with laser energy, for the embodiments described herein, laser annealing is performed later in the manufacturing process such that the region to be annealed is buried beneath subsequently deposited thin films. In first embodiments, an overlying thin film is irradiated with energy being coupled through the overlying thin film to the region to be annealed. In other embodiments the overlying layers may be transparent to the incident laser and serve only to maintain the morphology of the buried region. By performing the laser anneal later in the manufacturing process one or more of dopant activation, crystallinity, morphology, or phase of the annealed region is set after other thermal treatments that would otherwise degrade the region are completed (e.g., a pmos anneal is performed after an nmos formation). One or more of dopant activation, crystallinity, morphology, or phase of the annealed region may therefore be improved in the completed device to affect a parametric improvement, such as reduced $R_{ext}$, reduced $R_c$, or reduced series resistance ($R_s$), etc. Pattern effects associated with laser anneal are also reduced in the embodiments where a deposited metal thin film (e.g., contact metal) serves to couple the laser energy into the buried region(s). With a metal thin film, laser energy is readily coupled into localized regions of the microelectronic device with which the metal thin film is in contact with. As such, techniques described herein are applicable for laser annealing any buried region disposed below a deposited layer, whether transparent or opaque to the laser employed.

FIG. 1 is a flow diagram illustrating a method 100 including a laser anneal of a buried gate electrode, in accordance with an embodiment. Although method 100 is directed at a exemplary metal-oxide-semiconductor (MOS) field effect transistor (FET), one of ordinary skill may readily apply the techniques described in the context of the MOS transistor to the fabrication of other microelectronic devices. FIGS. 2A-2E are cross-sectional depictions of an exemplary planar MOSFET embodiment of the method illustrated in FIG. 1. One of skill in the art will appreciate that a planar FET is merely for illustration as other FET architectures, including non-planar (fin) FETs, nanowire FETs, and the like.

Figure 2A:
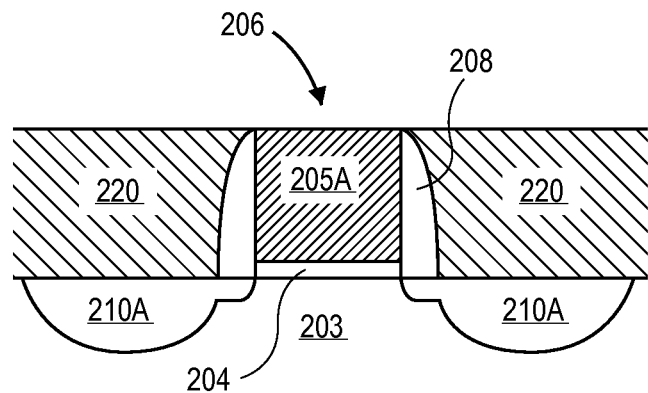
FIGS. 2A-2E are cross-sectional depictions of an exemplary embodiment of the method illustrated in FIG. 1.

Referring to FIG. 1, method 100 begins with forming a gate stack at operation 105. The gate stack includes at least a gate electrode material disposed over a semiconductor channel region with a gate dielectric disposed there between. The gate electrode material may include one or more doped semiconductors (e.g., p-type or n-type poly-silicon) and/or include one or more metals. FIG. 2A illustrates one exemplary embodiment where a gate stack 206 includes a gate metal 205A disposed on a gate dielectric 204 over a semiconductor channel region 203. In the exemplary embodiment, the semiconductor channel region 203 consists essentially of silicon, but may also be an alloy of silicon (e.g., SiGe), consist essentially of germanium, consist essentially of a group III-V semiconductor (e.g., GaAs, InGaAs, etc.), or a group III-N (e.g., GaN, InGaN, etc.). In the exemplary embodiment, the gate dielectric 204 is a high-k dielectric having a dielectric constant above that of silicon nitride (e.g., HfO2, etc.), though silicon dioxide and silicon nitride may also be utilized. Disposed on either side of the gate stack 206 is a dielectric spacer 208 and a source/drain 210. In the exemplary embodiment, the source/drain 210 is doped and activated (e.g., n-type for an NMOS device and p-type for a PMOS device introduced with a conventional implant and activated by any conventional furnace thermal anneal, rapid thermal anneal, microwave anneal, flash anneal, or laser anneal). An ILD 220 (e.g., carbon doped silicon dioxide) is disposed over the source/drain 210.

The gate electrode may either be a single material (e.g., poly-Si or a single metal) or include a plurality of material layers to form a gate electrode stack (e.g., a stack of metals). For embodiments where the gate electrode is a single material, post-gate electrode formation processing, such as implantation and alloying, may be utilized to tailor the effects or limit the extent of a subsequent laser anneal to the entire gate electrode thickness or to only a portion of the gate electrode. Such processing may be performed while the entire length of gate electrodes are exposed (e.g., out of the page in FIG. 2B) or while only portions to be contacted by upper levels of metal are exposed to the post processing (e.g., after formation of a contact opening exposing the gate electrode).

Figure 2B:
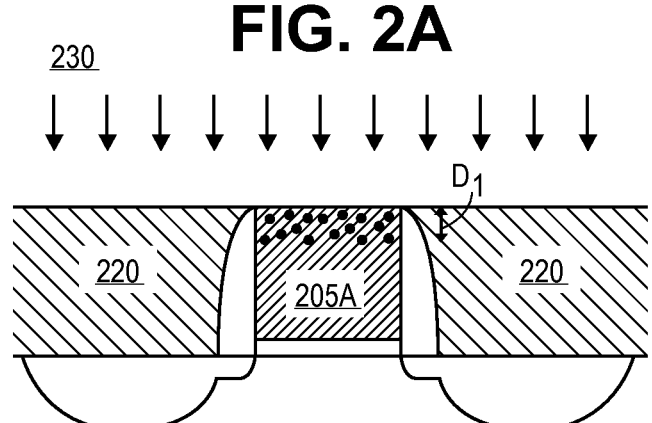

In the embodiment illustrated by FIG. 2B for example, while a top surface of the gate metal 205A is entirely exposed, an implant 230 is performed to modulate the melting temperature of a least a portion of the thickness of the gate metal 205A. In one such embodiment, the implant reduces the melting temperature of a top portion of the gate metal 205A above an implant depth $D_1$ (e.g., a Xenon implant may be performed to lower the melting temperature of a gate metal 205A comprising Tantalum.

In an alternative embodiment, an alloying metal may be deposited on the gate 205A to modulate the melting temperature of at least a portion of the gate metal 205A. Such modulation may serve to render a subsequent laser anneal selective to the gate electrode relative to surround material, or selective to a first portion of the gate electrode relative to a second portion. The alloy formed may render the alloyed portion with a higher melting temperature than the unalloyed portion, or render the alloyed portion with a lower melting temperature than the unalloyed portion. In one embodiment, an aluminide of the gate metal is formed on a top thickness of the gate metal and the aluminide has a lower melting temperature than an underlying portion of the gate metal 205A.

For embodiments where the gate electrode includes a plurality of gate metals, selection of the particular gate metals may be utilized to achieve one or more of gate metal grain growth, gate metal phase change, gate metal reflow, or gate metal work function modulation over only a portion of the gate electrode thickness during a subsequent anneal. For example, in one embodiment where a gate electrode includes a work function metal and a capping metal, the capping metal has a lower melting temperature than the work function metal so that a subsequent laser anneal affects the capping layer without significantly altering the work function metal. For either single material gate electrode embodiments or multi-layered gate electrode embodiments, the gate stack 206 may further entail a silicidation (salicidation) of the gate electrode where a silicide is formed on a top thickness of the gate metal (e.g., for forming a contact to the gate stack 206).

Figure 2C:
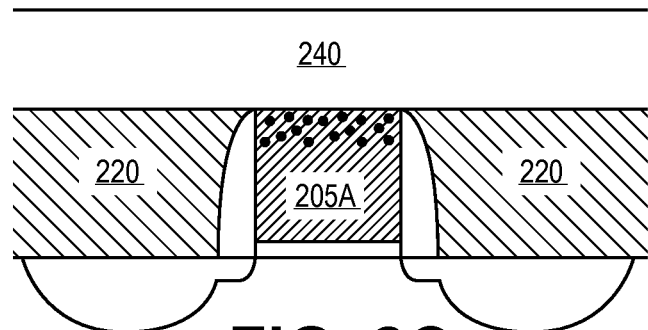

Returning to FIG. 1, at operation 110, the gate electrode is covered over with a deposited thin film, such as an ILD. FIG. 2C illustrates an exemplary embodiment where the ILD 240 is deposited on the gate metal 205A, thereby burying the gate metal 205A. Any contact patterning process known in the art (e.g., a photolithographic patterning and plasma etch of the ILD 240) may then be performed to expose a portion of the top surface area of the gate electrode. Pre-anneal processing of this exposed gate metal may then be performed. For example, a gate electrode implant may be performed to modulate a melting temperature of the exposed surface of the gate electrode in preparation for alloying of an interface between the gate electrode and a subsequently deposited gate contact metal.

Figure 2D:
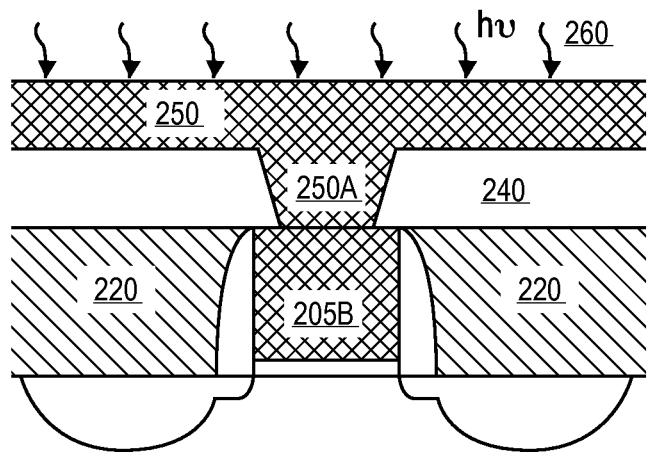

At operation 120 (FIG. 1), a gate contact metal is deposited over the gate electrode to make contact with the gate electrode. As shown in FIG. 2D, a contact opening formed in the ILD 240 is filled with a gate contact metal, such as tungsten, a stack of metals, etc. Following a blanket metal film deposition, there is a contiguous metal thin film 250 disposed over the substrate (e.g., over entire wafer area) with the gate via 250A making contact down to the gate stack.

In an embodiment, the gate electrode is annealed by exposing the gate contact metal to pulsed laser energy during operation 140 (FIG. 1) and as further illustrated for a gate metal embodiment in FIG. 2D. The pulsed laser energy may be provided by any laser anneal technique known in the art, employing a commercially available laser with the desired fluence, wavelength, pulse frequency, etc., known to be applicable for achieving the desired annealing effect (e.g., grain growth, phase change, reflow, work function modulation) in a particular gate electrode material.

Although the gate electrode is buried during the laser anneal, material distinctions render the laser anneal selective. For example, a semiconductor channel region 203 (FIG. 2A) is not melted by the annealing of the gate metal during the laser irradiation 260, although an entire thickness of the gate metal 205A is melted and resolidified as annealed gate metal 205B. In other embodiments, only a portion the gate electrode material having a lowest melting temperature is melted. For example, where the gate electrode stack comprises a capping metal disposed on a work function metal, the laser anneal at operation 140 melts only one of the capping metal or work function metal. As another example, where the gate electrode comprises an implanted region only where the contact opening is, an alloying between the gate contact metal and gate electrode is spatially confied to the implant depth and to the surface area of the contact. It should also be noted that even where no portion of the gate electrode thickness is melted, effects such as changes in gate electrode work function, grain growth, etc. may still be achieved during operation 140. Because the laser anneal is performed after the gate via 250A is formed, thermally induced degradation of the gate electrode material properties that would otherwise be attributable to thermal cycles occurring between the formation of the gate stack 206 and the formation of the gate via 250A may be avoided.

Figure 2E:
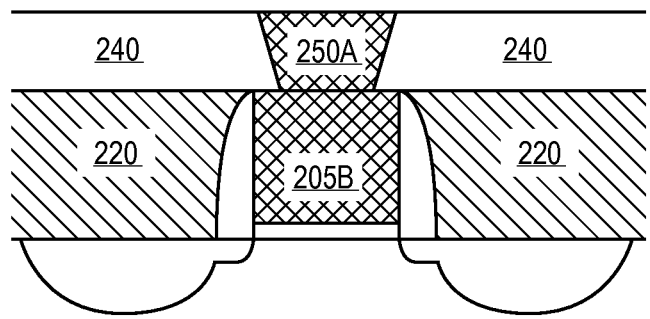

Although the laser anneal of operation 140 may be performed after patterning the contact metal, in advantageous embodiments the laser anneal is performed prior to patterning the contact metal to reducing patterning effects typically associated with laser anneals. Returning to FIG. 1 for example, the device is completed at operation 150 using any techniques conventional to the particular device (e.g., conventional MOSFET fabrication) beginning with patterning the gate contact metal 250. Conventional techniques such as etching (e.g., plasma) or planarization (e.g., CMP polishing) may be employed to remove the gate contact metal overburden from the surface of the ILD 240 and leave the metal filled gate via 250A. Although a single damascene process is illustrated in FIG. 2E, other embodiments entail a dual damascene process.

Figure 3:
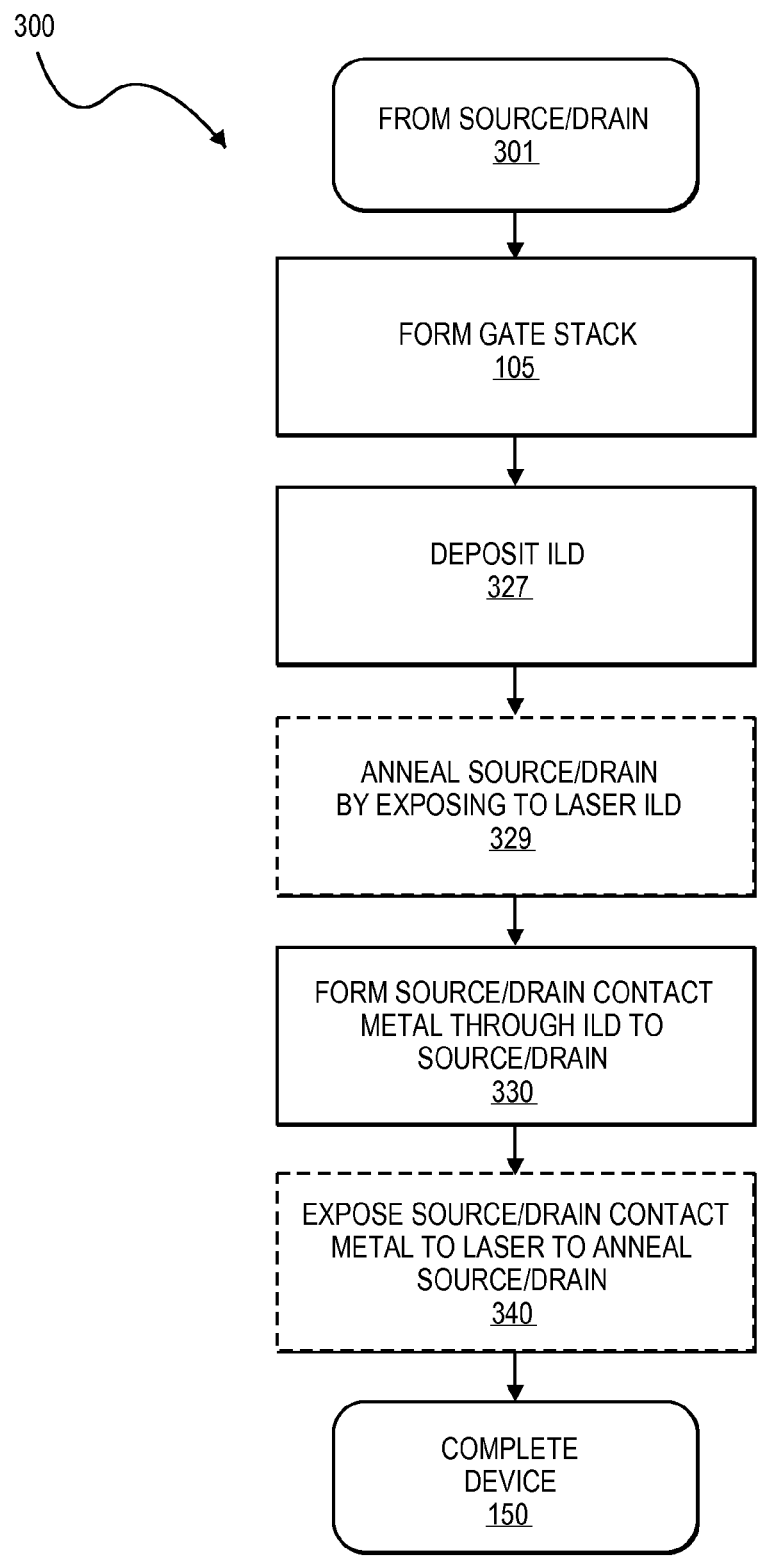
FIG. 3 is a flow diagram illustrating a method including a laser anneal of a buried source/drain, in accordance with an embodiment.

FIG. 3 is a flow diagram illustrating a method 300 including a laser anneal of a buried source/drain, in accordance with embodiments. The method 300 begins at operation 301 with the formation of a source/drain. A gate stack is then formed at operation 105, substantially as described elsewhere herein. At operation 327, an ILD is deposited and planarized. Depending on the embodiment, an anneal of the barrier is either performed prior to opening source/drain contacts in the deposited ILD, or subsequent to deposition of source/drain contact metallization into such openings in the ILD. These alternate embodiments are illustrated in FIG. 3 as operation 329 and operation 340 with source/drain contact metal being deposited to contact the source/drain at operation 330. While it would be possible to perform a laser anneal at both operations 329 and 340, exemplary embodiments employ a laser anneal at either operation 329 or operation 340.

Figure 4:
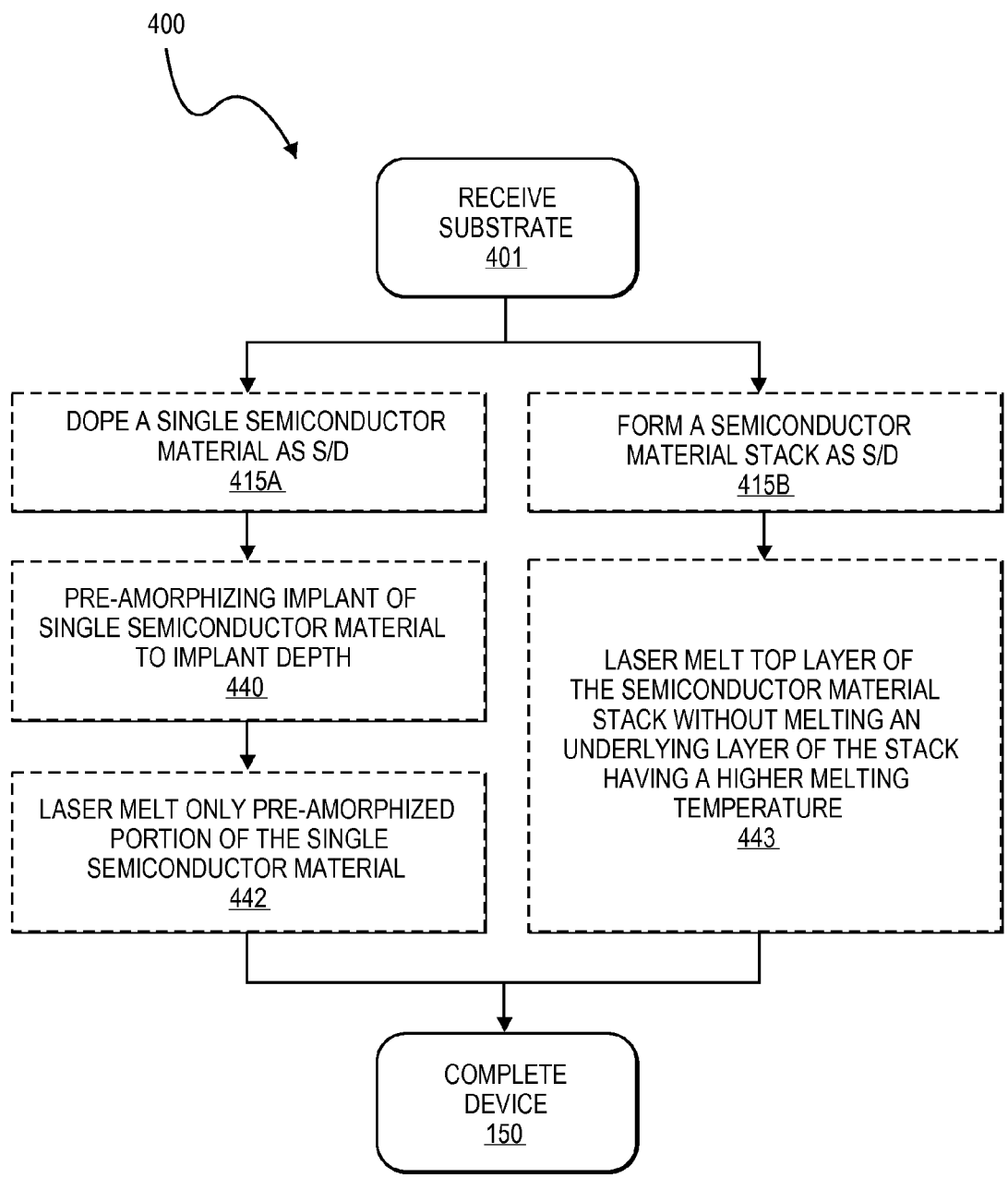
FIG. 4 is a flow diagram illustrating a method of selectively annealing a buried source/drain, in accordance with embodiments.

Depending on the source/drain formation process at operation 301, the subsequent laser anneal process at operations 329/340 may be made selective to the source/drain or to only a portion thereof. FIG. 4 is a flow diagram illustrating a method 400 of selectively annealing a buried source/drain as dependent on whether operation 301 entails a doping of a portion of a semiconductor substrate (e.g., to form a planar source/drain in a MOSFET) at the operation 415A or entails a deposition and doping of a semiconductor material on a substrate (e.g., to form a raised source/drain of a planar or non-planar MOSFET) at the operation 415B. As shown in FIG. 4, for embodiments where the source/drain comprises a single semiconductor material, a pre-amorphizing implant is performed at operation 440 to amorphize the semiconductor material to a desired depth. Then at operation 442, the laser anneal melts only the pre-amorphized portion of the semiconductor material.

Figure 5A:
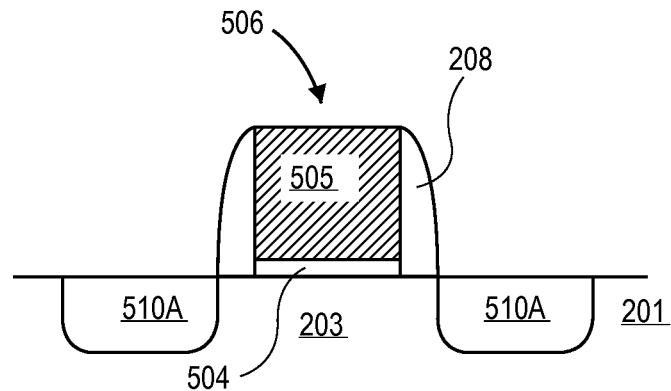
FIGS. 5A-5E are cross-sectional depictions of an exemplary embodiment of the method illustrated in FIG. 3.

FIGS. 5A-5E are cross-sectional depictions of an exemplary embodiment of the method illustrated in FIG. 3, where the pre-amorphizing implant of operation 442 is employed in a planar transistor architecture. In FIG. 5A, the source/drain 510A is formed in the substrate on opposite sides of a gate stack 506 disposed over a channel region 203 and including a gate dielectric 504 and gate electrode 505. For example, in an NMOSFET, an N-type dopant, such as phosphorus or arsenic, may be implanted into the substrate 201. Or, in a PMOSFET, an P-type dopant, such as boron, may be implanted into the substrate 210. An activation anneal is then performed to electrically activate dopants within the source/drain 510A. In embodiments, the activation anneal is at least one of a furnace thermal anneal, a rapid thermal anneal, a microwave anneal, a flash anneal, or laser anneal.

Figure 5B:
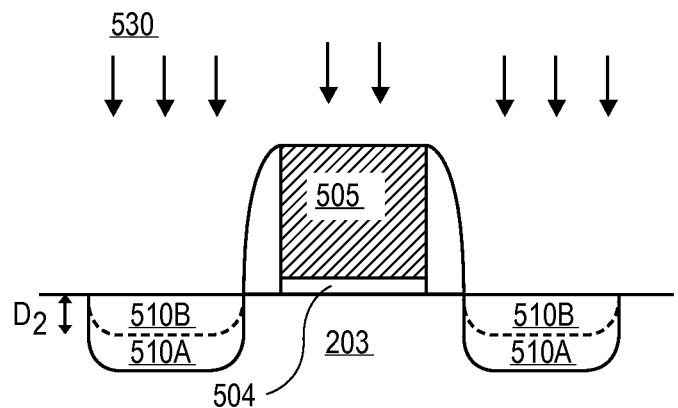

In FIG. 5B a pre-amorphizing implant 530 (e.g., performed at operation 442) includes one or more of a beamline ion implantation, an angled implantation, or a conformal plasma implantation of an amorphizing species (e.g., silicon, germanium, xenon, etc.). The pre-amorphizing implant 530 forms an amorphized region 510B down to an implant depth $D_2$. In the illustrative embodiment, the pre-amorphizing implant 530 is performed at a point in the device fabrication process where the source/drain 510A is un-buried (i.e., exposed) so that substantially all of the surface area of the source/drain 510A is amorphized.

Figure 5C:
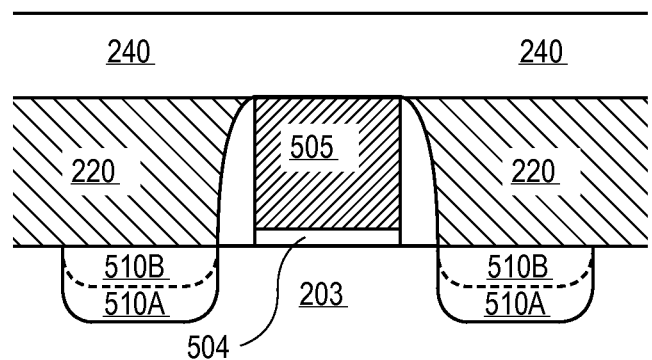

As shown in FIG. 5C, ILD layers 220 and 240 are deposited over the source/drain 510A, burying the amorphized region 510B. A contact open process (e.g., photolithographic patterning and plasma etch of the ILD layers 220 and 240) is then performed to expose a portion of the source/drain. In embodiments, the pre-amorphizing implant 530 is performed following the contact open process (e.g., with or without a sacrificial masking material) such that only the portion of the source/drain surface area exposed by the contact opening is amorphized. For example, where a selective alloying of a contact metal-to-source/drain interface is desired, the pre-amorphizing implant may be limited in area to only the area of the contact opening.

Figure 5D:
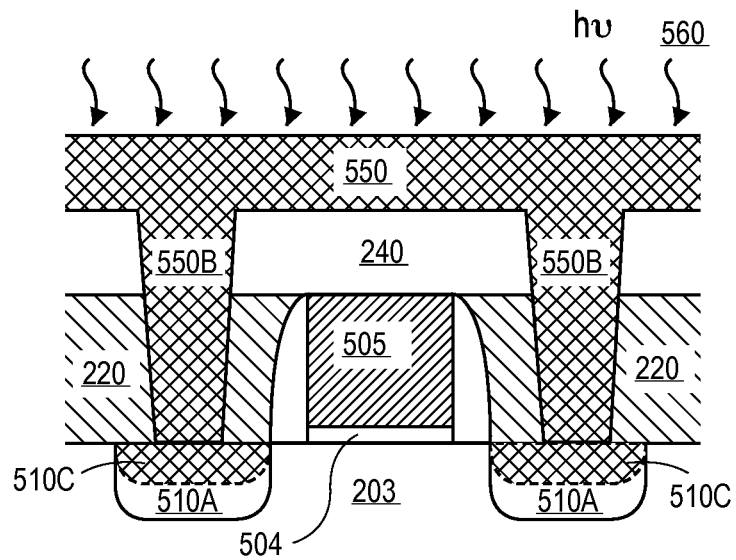
Figure 5E:
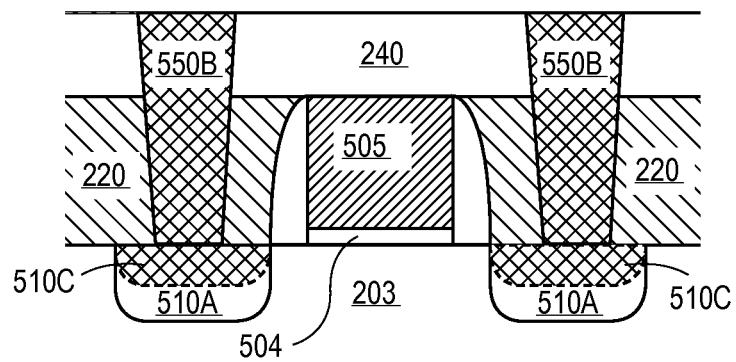

A source/drain contact metal is then formed to contact the source/drain (e.g., at operation 330 in FIG. 3). As illustrated in FIG. 5D, a source/drain contact metal 550 is blanket deposited over an entire surface of a substrate and contacts the amorphized region of the source/drain through metal filled openings (vias) 550B in the ILD layers 220 and 240. In the exemplary embodiment, with the source/drain contact metal still a contiguous metal thin film, a pulsed laser anneal is performed (e.g., at operation 442) exposing the source/drain contact metal to energy 560 from any conventional laser source (e.g., pulsed) operating with any conditions known in the art applicable for achieving the desired anneal effect for the particular source/drain material state. For example, any of melt, reflow, grain growth, activation of dopants, etc. may be achieved as dependent on the irradiation parameters and the initial state of the source/drain material. In the exemplary embodiment, effects of the laser anneal are selective to the amorphized source/drain region 510B, for example causing the amorphized source/drain region 510B to melt and re-solidify to form a super-activated source/drain region 510C.

Returning to FIG. 3, the device is continued at operation 150 using any techniques conventional to complete fabrication of the particular device (e.g., conventional MOSFET fabrication) beginning with patterning the source/drain contact metal 250. Conventional techniques such as etching (e.g., plasma) or planarization (e.g., CMP polishing) may be employed to remove the source/drain contact metal overburden from the surface of the ILD 240 and leave the metal filled source/drain via 250B. Although a single damascene process is illustrated in FIG. 2E, other embodiments entail a dual damascene process. Furthermore, while the laser anneal of operation 330 is performed prior to patterning the source/drain contact metal to reduce patterning effects of the laser irradiation, the laser anneal may also be performed after patterning of the source/drain contact metal.

Figure 6A:
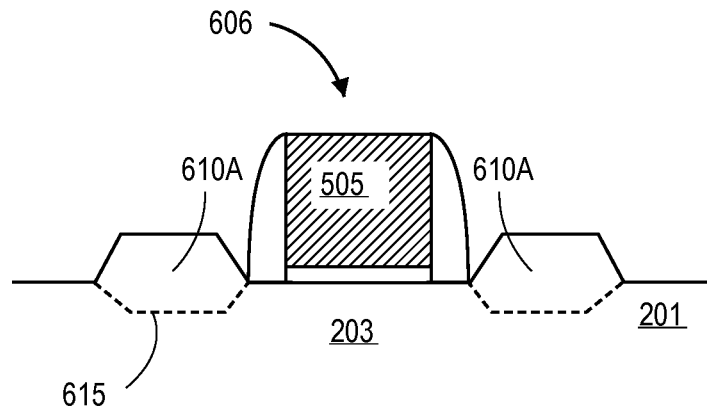
FIGS. 6A, 6B are cross-sectional depictions of an exemplary embodiment of the method illustrated in FIG. 3.
Figure 6B:
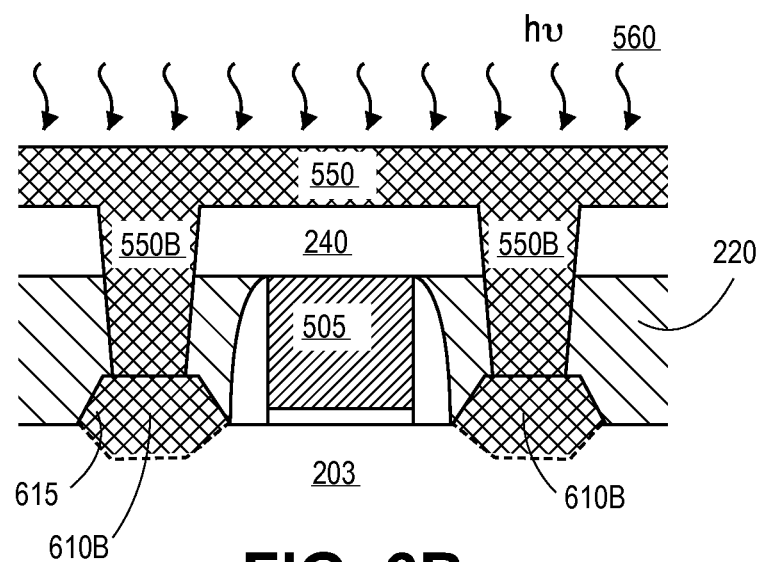

FIGS. 6A-6B are cross-sectional depictions of an exemplary embodiment of the method illustrated in FIG. 3, where the pre-amorphizing implant of operation 442 is employed with a non-planar transistor architecture. As shown in FIG. 6A, on either side of a gate stack 606 a source/drain is formed including a deposited source/drain semiconductor 610A raised above the surrounding substrate 201. The deposited source/drain semiconductor 610A is formed on at least one surface of the substrate 201 which may itself be planar or a fin structure. In embodiments, the deposited source/drain semiconductor 610A includes an electrically activated dopants (e.g., n-type for an NMOS device and p-type for a PMOS device) which may have been incorporated in-situ during the deposition of the source/drain semiconductor 610A or implanted subsequent to the deposition of the source/drain semiconductor 610A using conventional techniques.

In FIG. 6A a pre-amorphizing implant (e.g., performed at operation 442) including one or more of a beamline ion implantation, an angled implantation, or a conformal plasma implantation of an amorphizing species (e.g., silicon, germanium, xenon, etc.) is performed substantially as described for the planar transistor embodiment to form an amorphize the deposited semiconductor down to an implant depth 615 (which may be below a top surface of the substrate 201 as depicted in FIG. 6A where the source/drain formation entails a backfilling of source/drain recesses etched into the substrate 201).

Processing then proceeds substantially as described elsewhere herein for the planar embodiment with deposition of ILD (e.g., layers 220 and 240), contact opening, and source/drain contact metal deposition to form the source/drain contact metal 550 and source/drain vias 550B. Laser anneal (e.g., at operation 442) is then performed to expose the source/drain contact metal to energy 560 to achieve any of melt, reflow, grain growth, activation of dopants, etc. within the now buried source/drain semiconductor 610A. In the exemplary embodiment, effects of the laser anneal are selective to the amorphized region above the implant depth 615, for example causing the amorphized region to melt and re-solidify selectively to surrounding deposited semiconductor and/or surrounding substrate 201 to form a super-activated raised source/drain region 610B.

In one advantageous embodiment, where an amorphizing implant amorphizes the entire semiconductor volume of a raised source/drain, the entire raised source/drain volume is melted by the laser anneal performed at operation 443 to form the super-activated raised source/drain semiconductor 610B. While it would be difficult to melt an entire volume of the source/drain semiconductor 610A immediately following deposition of the source/drain semiconductor 610A without flowing the melt losing the raised morphology, with the laser anneal performed later in the process as described herein, the raised source/drain morphology of a melt is maintained by surrounding dielectrics (e.g., ILD 220).

Figure 6C:
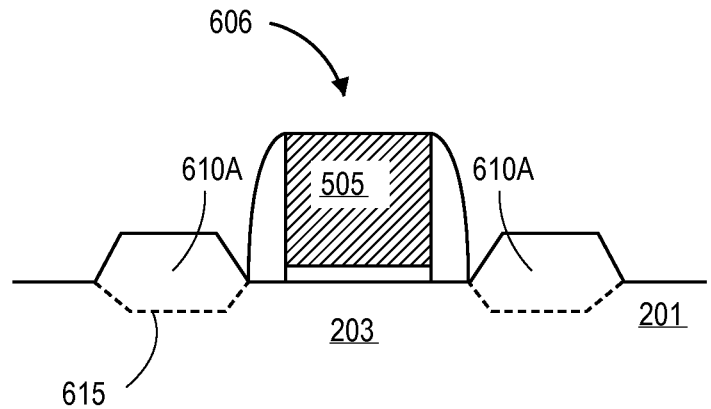
FIGS. 6C, 6D are cross-sectional depictions of an exemplary embodiment of the method illustrated in FIG. 3.
Figure 6D:
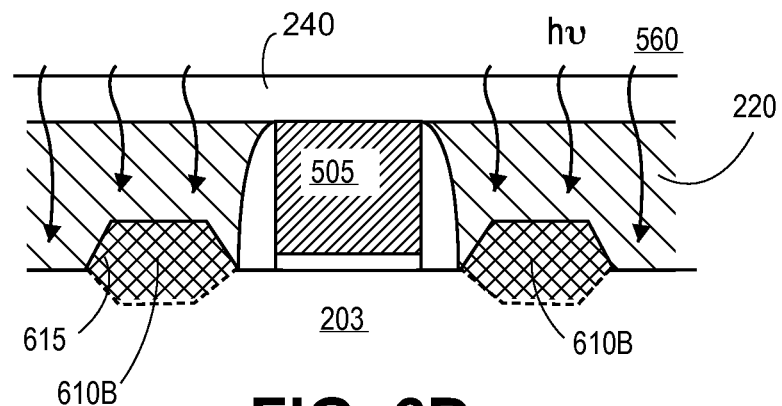

FIGS. 6C-6D are cross-sectional depictions of an exemplary embodiment of the method illustrated in FIG. 3, where the pre-amorphizing implant of operation 442 is employed with a non-planar transistor architecture to provide the structure in FIG. 6C substantially as described elsewhere herein for FIG. 6A.

As shown in FIG. 6D, a laser anneal 560 of the source-drain is performed after deposition of the inter-layer dielectric (ILD). In the exemplary embodiment wherein the ILD is transparent to the incident radiation (e.g., when a visible or $CO_2$ laser is employed), the source/drain 601B is melt annealed by direct heating selective to the amorphized region/region with the lowest melting point. In this embodiment, the ILD 240 (and any other intervening layers) encapsulate the melted region and preserve morphology before and after the melt anneal process. Depending on the implementation, other advantages may include dose preservation (by encapsulating the source-drain 610A prior to anneal) or increased activation (by performing the anneal after other high temperature processes are complete).

In one such embodiment, a SiGe raised source-drain 610A with high in-situ boron is formed in a PMOS device. Fabrication continues through conventional NMOS formation in which a furnace anneal activates an As-implanted conventional source-drain (e.g., at operation 301). A pulsed laser anneal with a visible laser is performed after ILD oxide deposition (e.g., at operation 327), directly heating the PMOS source/drain 610A and selectively melting the low $T_m$ SiGe region. The encapsulating ILD 240 prevents SiGe deformation during anneal and prevents boron dose loss. Because the laser anneal is performed after NMOS formation, the NMOS activation anneal does not affect the active boron dose.

Figure 7A:
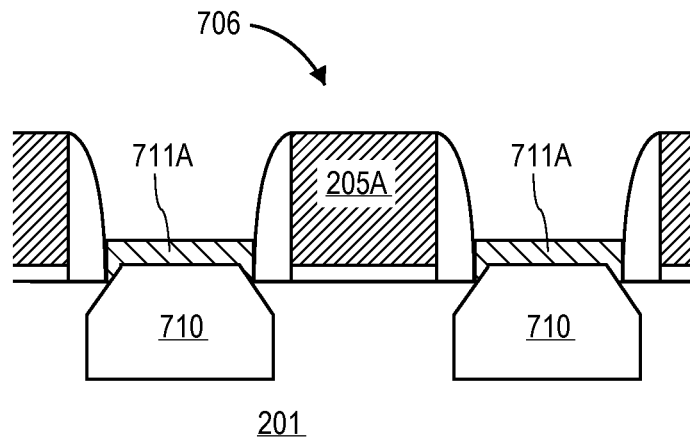
FIGS. 7A, 7B are cross-sectional depictions of an exemplary embodiment of the method illustrated in FIG. 3.
Figure 7B:
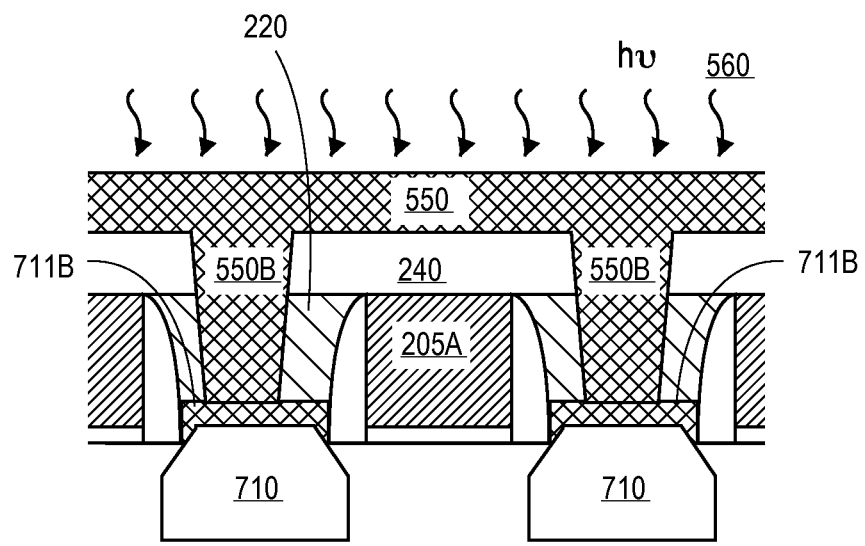

FIGS. 7A-7B are cross-sectional depictions of an exemplary embodiment of the method illustrated in FIG. 3, where the source/drain includes a plurality of semiconductor material layers formed at operation 415B (FIG. 4). The deposited source/drain semiconductors 710, 711A are formed on at least one surface of the substrate 201 which may itself be planar, recessed, or a fin structure. As shown in FIG. 7A, on either side of a gate stack 706, a source/drain is formed including a plurality of deposited source/drain semiconductors 710 and 711A, one or more of which is raised above the surrounding substrate 201. In such embodiments, the source/drain semiconductors 710 and 711A are chosen to contain the effect of the subsequent laser anneal to within a portion of the source/drain. For example, in an embodiment source/drain semiconductors 710 and 711A have melting temperatures which are different (e.g., by at least 100° C. and preferably by 200° C. or more) so that less than an entire thickness of the deposited source/drain semiconductor is melted by the subsequent laser anneal. In one exemplary embodiment, a silicon layer is first deposited (e.g., as source/drain semiconductor 710) followed by a GaAs layer (e.g., as source/drain semiconductor 711A). In another exemplary embodiment, a silicon layer is first deposited (e.g., as source/drain semiconductor 710) followed by a SiGe layer (e.g., as source/drain semiconductor 711A). In another exemplary embodiment, an InP layer is first deposited (e.g., as source/drain semiconductor 710) followed by a GaP layer (e.g., as source/drain semiconductor 711A).

Following deposition of the source/drain semiconductor layers, an activation anneal may be performed to electrically activate any in-situ deposited dopants (and/or subsequently implanted dopants), such as n-type dopants for an NMOS device and p-type dopants for a PMOS device, within the source/drain semiconductors. However, depending on the deposition process employed at operation 415B, in-situ deposited dopants may already be electrically activated in which case an activation anneal is not employed.

Processing then proceeds substantially as described elsewhere herein with deposition of ILD (e.g., layers 220 and 240), contact opening, and source/drain contact metal deposition to form the source/drain contact metal 550 and source/drain vias 550B. Laser anneal (e.g., at operation 443) is then performed to expose the source/drain contact metal to energy 560 to achieve any of melt, reflow, grain growth, activation of dopants, etc. within the now buried source/drain semiconductor 710 or 711A. In the exemplary embodiment, effects of the laser anneal are selective to the semiconductor 711A, for example causing the semiconductor 710 to melt and re-solidify selectively to the underlying source/drain semiconductor 710, surrounding dielectric, and/or surrounding substrate 201 to form a super-activated source/drain region 711B.

In one advantageous embodiment, the super-activate source/drain region 711B is raised relative to surrounding semiconductor layers (e.g., substrate 201 and source/drain semiconductor 710). While it would be difficult to melt an entire volume of the source/drain semiconductor 711A immediately following deposition of the source/drain semiconductor 711A without flowing the melt and losing the raised morphology, with the laser anneal performed later in the process as described herein, the raised source/drain morphology of a melt is maintained by surrounding dielectrics (e.g., ILD 220).

In further embodiments, the method 100 is combined with the method 300 to laser anneal both a buried gate electrode and a buried source/drain subsequent to forming contact metal to each. For certain such embodiments, a single contact metal may be advantageously employed for both the gate electrode and the source/drain (e.g., gate contact metal 250 is the source/drain contact metal 550) and therefore a single laser anneal process may be utilized to concurrently anneal both the both a buried gate electrode and a buried source/drain. Of course, where gate contact metal and the source/drain contact metal are distinct and separately formed, a combination of the method 100 and method 300 may entail performing a plurality of laser anneal processes (e.g., operations 140, 329 and 340) in sequence with either one of a buried gate electrode anneal or a buried source/drain anneal performed prior to the anneal of the other.

Figure 8:
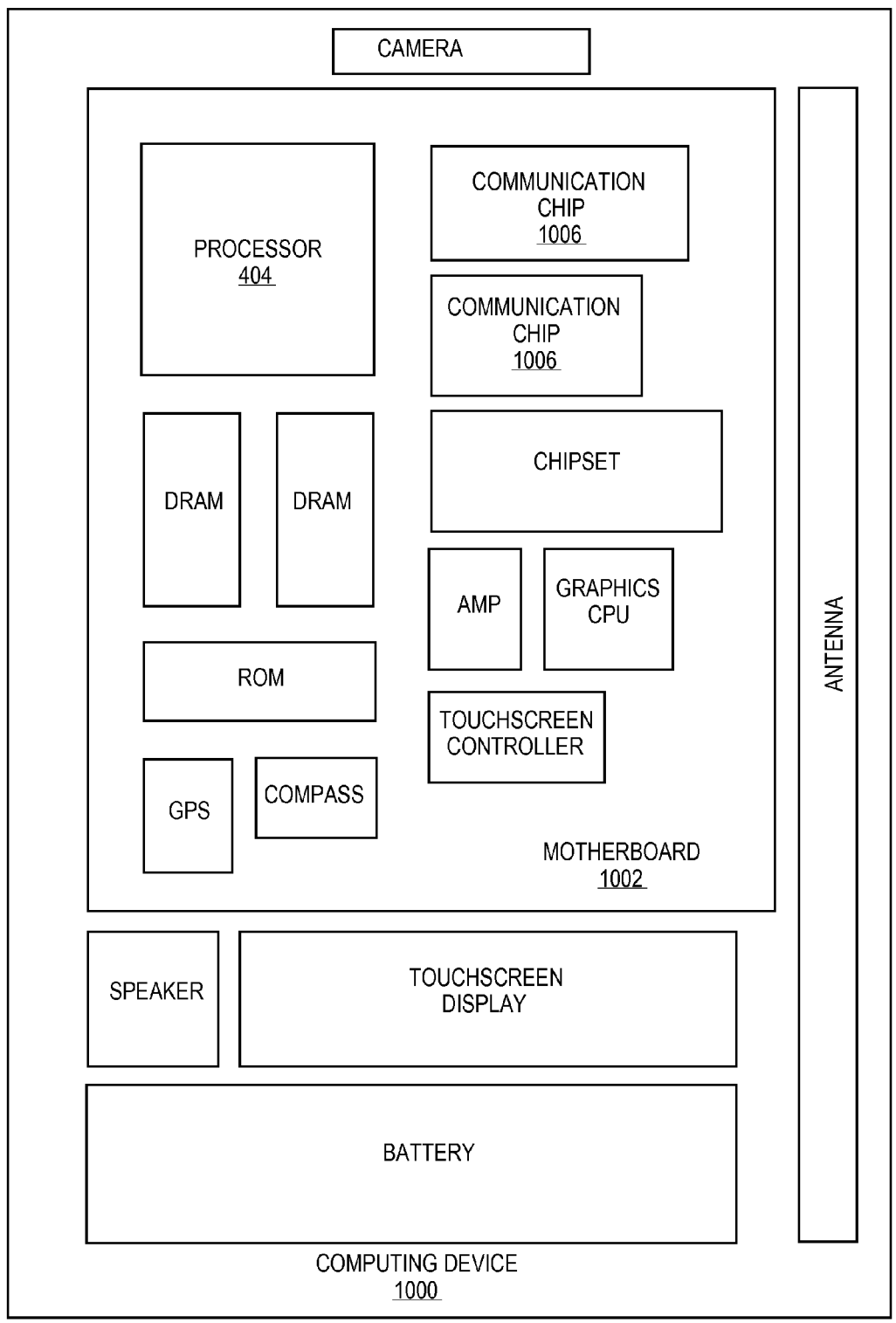
FIG. 8 is a functional block diagram of a computing device employing MOS transistors fabricated in accordance with an embodiment of the present invention.

FIG. 8 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as transistors that are formed, in part, with melts of buried regions. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as transistors that are formed, in part, with melts of buried regions.

In further implementations, another component housed within the computing device 1000 may contain an integrated circuit die that includes one or more devices, such as transistors that are formed, in part, with melts of buried regions.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of forming microelectronic device, the method comprising:
    forming on a substrate a gate stack including a gate metal disposed over a gate dielectric;
    depositing an interlayer dielectric to cover the gate metal;
    forming a gate contact metal through the interlayer dielectric (ILD) to the gate metal; and
    annealing the gate metal by exposing the gate contact metal to a pulsed laser energy.

2. The method of claim 1, wherein annealing the gate metal comprises melting at least a portion of the gate metal.

3. The method of claim 2, wherein a semiconductor channel region disposed below the gate stack is not melted by the annealing of the gate metal.

4. The method of claim 1, wherein forming the gate contact metal further comprises patterning a contact opening in the ILD; and
    blanket depositing the gate contact metal into the opening and covering the entire substrate; and
    wherein exposing the gate contact metal to the pulsed laser energy further comprises irradiating the gate contact metal with the pulsed laser energy prior to patterning the gate contact metal by an etch or polish.

5. The method of claim 1, further comprising modulating the melting temperature of at least a portion of the gate metal by implanting dopants into the gate metal prior to the annealing.

6. The method of claim 5, wherein the implanting is performed prior to depositing the ILD and lowers the melting temperature of the gate metal.

7. The method of claim 1, wherein forming the gate stack further comprises:
    depositing a gate dielectric on a channel region of the substrate semiconductor;
    depositing the gate metal over the gate dielectric; and
    patterning the gate metal by etch or polish.

8. The method of claim 7, wherein depositing the gate metal further comprises depositing a gate metal stack including a plurality of compositionally distinct metals having different melting temperatures, and wherein annealing the gate metal further comprises melting fewer than all of the metals in the stack.

9. The method of claim 7, further comprising: forming a source/drain on opposite sides of the channel region prior to forming the gate stack
    covering the source/drain with the ILD;
    annealing the source/drain by melting at least a portion of the source/drain by exposing the ILD or a source drain contact metal to the pulsed laser energy.

10. The method of claim 9, further comprising:
    amorphizing at least a portion of the source/drain prior to forming the gate stack, wherein annealing the source/drain comprises melting the amorphized portion of the source/drain.

11. The method of claim 9, wherein forming the source/drain further comprises depositing a semiconductor material on the substrate, the semiconductor material having a lower melting temperature than the substrate, and wherein annealing the source/drain comprises melting the deposited semiconductor material.

12. A method of forming microelectronic device, the method comprising:
    depositing a gate dielectric on a channel region of a semiconductor substrate;
    depositing a gate metal over the gate dielectric wherein depositing the gate metal further comprises depositing a gate metal stack including a plurality of compositionally distinct metals having different melting temperatures;
    patterning the gate metal by etch or polish;
    depositing an interlayer dielectric to cover the gate metal;
    forming a gate contact metal through the interlayer dielectric (ILD) to the gate metal; and
    annealing the gate metal by exposing the gate contact metal to a pulsed laser energy wherein annealing the gate metal further comprises melting fewer than all of the metals in the stack.

13. A method of forming microelectronic device, the method comprising:
    forming a gate stack, wherein for making the gate stack comprises:
        depositing a gate dielectric on a channel region of a semiconductor substrate;
        depositing a gate metal over the gate dielectric; and
        patterning the gate metal by etch or polish;
    forming a source/drain on opposite sides of the channel region prior to forming the gate stack;
    depositing an interlayer dielectric to cover the gate metal and the source/drain;
    forming a gate contact metal through the interlayer dielectric (ILD) to the gate metal; and
    annealing the gate metal by exposing the gate contact metal to a pulsed laser energy and annealing the source/drain by melting at least a portion of the source/drain by exposing the ILD or a source drain contact metal to the pulsed laser energy.

14. The method of claim 13, further comprising:
    amorphizing at least a portion of the source/drain prior to forming the gate stack, wherein annealing the source/drain comprises melting the amorphized portion of the source/drain.

15. The method of claim 13, wherein forming the source/drain further comprises depositing a semiconductor material on the substrate, the semiconductor material having a lower melting temperature than the substrate, and wherein annealing the source/drain comprises melting the deposited semiconductor material.

* * * * *